United States Patent
Mori

(10) Patent No.: US 7,583,553 B2
(45) Date of Patent: Sep. 1, 2009

(54) SEMICONDUCTOR MEMORY AND REFRESH CYCLE CONTROL METHOD

(75) Inventor: Kaoru Mori, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 64 days.

(21) Appl. No.: 11/797,817

(22) Filed: May 8, 2007

(65) Prior Publication Data

US 2007/0268766 A1 Nov. 22, 2007

(30) Foreign Application Priority Data

May 19, 2006 (JP) ............................. 2006-140605

(51) Int. Cl.
*G11C 7/00* (2006.01)
(52) U.S. Cl. .................. 365/222; 365/212; 365/241
(58) Field of Classification Search ............. 365/222, 365/212, 241, 201, 228, 229, 230.06, 233, 365/211, 189.09; 356/203
See application file for complete search history.

(56) References Cited

U.S. PATENT DOCUMENTS

| 6,707,745 | B2 | 3/2004 | Mizugaki |
| 6,756,856 | B2 | 6/2004 | Song et al. |
| 6,963,518 | B2 * | 11/2005 | Sasaki et al. ............ 365/236 |
| 7,149,644 | B2 | 12/2006 | Kobayashi et al. |
| 2003/0081484 | A1 | 5/2003 | Kobayashi et al. |
| 2006/0023545 | A1 | 2/2006 | Ito et al. |
| 2007/0043522 | A1 * | 2/2007 | Kobayashi et al. ............ 702/57 |

FOREIGN PATENT DOCUMENTS

| DE | 10163306 A | 4/2003 |
| EP | 0851427 A2 | 7/1998 |
| JP | 2003-005861 A | 1/2003 |
| JP | 2003-100074 A | 4/2003 |

* cited by examiner

*Primary Examiner*—Dang T Nguyen
(74) *Attorney, Agent, or Firm*—Arent Fox LLP

(57) ABSTRACT

A semiconductor memory and a refresh cycle control method that reduce a standby current by properly changing a refresh cycle according to the temperature of the semiconductor memory. A temperature detection section detects the temperature of the semiconductor memory. A cycle change control section sends a cycle change signal for changing a refresh cycle when the temperature of the semiconductor memory reaches a predetermined cycle change temperature. A refresh timing signal generation section generates a refresh timing signal and changes the cycle of the refresh timing signal in response to the cycle change signal. A constant current generation circuit generates an electric current for generating the refresh timing signal. A low-temperature constant current setting circuit designates the level of the electric current generated in the case that the temperature of the semiconductor memory is lower than or equal to the cycle change temperature. A high-temperature constant current setting circuit designates the level of the electric current generated in the case that the temperature of the semiconductor memory is higher than the cycle change temperature.

17 Claims, 10 Drawing Sheets

SEMICONDUCTOR MEMORY AND REFRESH CYCLE CONTROL METHOD

CROSS-REFERENCE TO RELATED APPLICATIONS

This application is based upon and claims the benefits of priority from the prior Japanese Patent Application No. 2006-140605, filed on May 19, 2006, the entire contents of which are incorporated herein by reference.

BACKGROUND OF THE INVENTION (1) Field of the Invention

This invention relates to a semiconductor memory and a refresh cycle control method, and more particularly to a semiconductor memory, such as a dynamic random access memory (DRAM), which needs refresh operation and a refresh cycle control method.

(2) Description of the Related Art

A technique for making the oscillation cycle of a self-oscillator on the basis of which the refresh cycle of a DRAM is determined constant by using an electric current generated by a constant current generation circuit is known.

In a process of testing a device, a predetermined number of fuses from a plurality of fuses used in a circuit included in a semiconductor memory are programmed. By doing so, the level of an electric current generated by a constant current generation circuit can be changed and a refresh cycle can be set. Usually a refresh cycle becomes short if an electric current outputted from a constant current generation circuit is large. Conversely, if an electric current outputted from the constant current generation circuit is small, then the refresh cycle becomes long. The following descriptions are based on this premise.

Conventionally, a technique for changing the refresh cycle of a semiconductor memory including a temperature sensor according to temperature is known as a method for decreasing a standby current (see, for example, Japanese Unexamined Patent Publication Nos. 2003-5861 and 2003-100074).

FIG. 8 shows an example of changing a refresh cycle according to temperature.

In FIG. 8, data retention time (tREF) of a memory cell is also shown. In general, as temperature falls, data retention time of a memory cell included in a DRAM becomes longer. Data retention time of a memory cell included in a DRAM becomes approximately constant at temperatures lower than or equal to some temperature (about 20° C.). Data retention time of a memory cell included in a DRAM has the above temperature characteristic. Therefore, as shown in FIG. 8, a standby current can be reduced by shortening the refresh cycle (REF cycle) at temperatures higher than, for example, 60° C. and by lengthening the refresh cycle (REF cycle) at temperatures lower than or equal to 60° C.

As stated above, a refresh cycle can be changed by the level of an electric current outputted from a constant current generation circuit. However, this electric current depends on temperature. The dependence of this electric current on temperature may change according to parameters, such as the threshold voltage of a transistor included in the constant current generation circuit.

FIGS. 9A, 9B, and 9C show the temperature characteristic of an electric current generated by a constant current generation circuit and the temperature characteristic of a refresh cycle.

As shown in FIG. 9A, current Iref generated by the constant current generation circuit may increase or decrease with a rise in temperature. This depends on, for example, variation in the parameters of a transistor included in a constant current generation circuit in each chip. Hereinafter, the case where the current Iref increases with a rise in temperature will be referred to as positive temperature dependence and the case where the current Iref decreases with a rise in temperature will be referred to as negative temperature dependence.

As shown in FIG. 9B, if the dependence of the current Iref on temperature is negative, the slope of the refresh cycle in respect to temperature becomes negative accordingly. As shown in FIG. 9C, if the dependence of the current Iref on temperature is positive, the slope of the refresh cycle in respect to temperature becomes positive accordingly. In each of FIGS. 9B and 9C, the desired value (target) of the refresh cycle at temperatures lower than or equal to a cycle change temperature (60° C. in FIGS. 9B and 9C) at which the refresh cycle is changed and the desired value (target) of the refresh cycle at temperatures higher than the cycle change temperature are shown.

In a conventional process for testing a device, a refresh cycle has been adjusted by changing the level of the current Iref so that it will match the desired value of the refresh cycle at temperatures higher than the cycle change temperature at some temperature. In each of FIGS. 9B and 9C, the refresh cycle matches the desired value at a temperature of, for example, 95° C.

Conventionally, however, a refresh cycle extension rate at a cycle change temperature is uniform. If a refresh cycle is adjusted only on the basis of the desired value of the refresh cycle at temperatures higher than the cycle change temperature as shown in FIGS. 9B and 9C, then the refresh cycle will vary at room and low temperatures due to variation in the dependence of the current Iref on temperature in each chip. If the refresh cycle varies and becomes shorter than the desired value, then a standby current increases.

In addition, the following problem arises because a refresh cycle extension rate is uniform.

FIGS. 10A and 10B show how a conventional refresh cycle adjustment is made.

FIG. 10A shows how a conventional refresh cycle adjustment is made in the case of the dependence of the current Iref on temperature in a chip being negative. FIG. 10B shows how a conventional refresh cycle adjustment is made in the case of the dependence of the current Iref on temperature in a chip being positive. Data retention time (tREF) of a memory cell is also shown.

In the left-hand figure of FIG. 10A, for example, there is only a small difference between a refresh cycle and data retention time at a temperature near a cycle change temperature. If the refresh cycle exceeds the data retention time, data held in a memory cell is lost. Accordingly, it is desirable that there should be a large difference between the refresh cycle and the data retention time. As shown in the right-hand figure of FIG. 10A, by decreasing a refresh cycle extension rate at the cycle change temperature, the difference between the refresh cycle and the data retention time can be widened.

However, there is a case where the dependence of the current Iref on temperature in a chip is negative and where, as shown in FIG. 10B, a refresh cycle is shorter than a desired value at temperatures lower than or equal to a cycle change temperature. In such a case, the refresh cycle becomes still shorter than the desired value by decreasing a refresh cycle extension rate as with a chip in which the dependence of the current Iref on temperature is positive. As a result, a standby current increases further.

SUMMARY OF THE INVENTION

The present invention was made under the background circumstances described above. An object of the present invention is to provide a semiconductor memory that can reduce a standby current by properly changing a refresh cycle according to the temperature of the semiconductor memory.

Another object of the present invention is to provide a refresh cycle control method that can reduce a standby current by properly changing a refresh cycle according to temperature.

In order to achieve the above first object, there is provided a semiconductor memory that needs refresh operation. This semiconductor memory comprises a temperature detection section for detecting temperature of the semiconductor memory, a cycle change control section for sending a cycle change signal for changing a refresh cycle at the time of the temperature of the semiconductor memory becoming a predetermined cycle change temperature, a refresh timing signal generation section for generating a refresh timing signal and for changing a cycle of the refresh timing signal in response to the cycle change signal, a signal generation circuit for generating a signal for generating the refresh timing signal, a first setting circuit for designating a level of the signal generated in a case of the temperature of the semiconductor memory being lower than or equal to the cycle change temperature, and a second setting circuit for designating a level of the signal generated in a case of the temperature of the semiconductor memory being higher than the cycle change temperature.

In addition, in order to achieve the above second object, there is provided a refresh cycle control method for a semiconductor memory that needs refresh operation. This refresh cycle control method comprises the steps of storing first designation information for designating a level of a signal for generating a refresh timing signal in a first setting circuit in a case of temperature of the semiconductor memory being lower than or equal to a cycle change temperature at which a refresh cycle is changed, storing second designation information for designating the level of the signal in a second setting circuit in a case of the temperature of the semiconductor memory being higher than the cycle change temperature, generating the signal the level of which is designated by the first designation information or the second designation information according to the temperature of the semiconductor memory, and generating the refresh timing signal by the use of the signal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1:
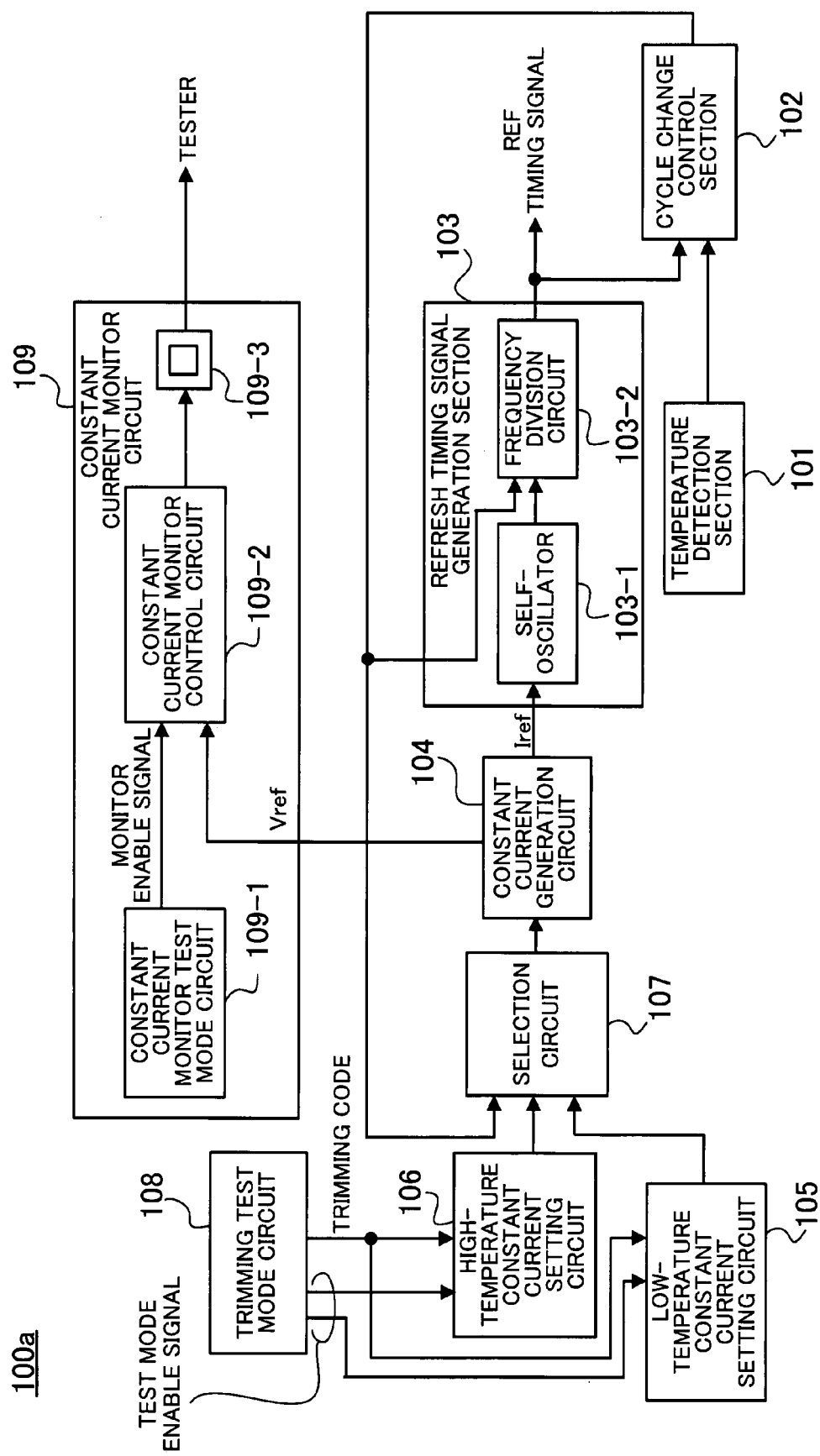
FIG. 1 shows the structure of a semiconductor memory according to a first embodiment of the present invention.

FIG. 1 shows the structure of a semiconductor memory according to a first embodiment of the present invention.

A semiconductor memory 100a according to a first embodiment of the present invention comprises a temperature detection section 101 for detecting temperature, a cycle change control section 102, a refresh timing signal generation section 103, a constant current generation circuit 104, a low-temperature constant current setting circuit 105, a high-temperature constant current setting circuit 106, a selection circuit 107, a trimming test mode circuit 108, and a constant current monitor circuit 109.

The temperature detection section 101 detects the temperature of the semiconductor memory 100a.

When temperature detected by the temperature detection section 101 reaches a cycle change temperature (60° C., for example), the cycle change control section 102 sends a cycle change signal for changing a refresh cycle.

The refresh timing signal generation section 103 includes a self-oscillator 103-1 and a frequency division circuit 103-2. The self-oscillator 103-1 generates a refresh timing signal having a certain refresh cycle on the basis of current Iref for generating the refresh timing signal. When the cycle change signal is inputted, the frequency division circuit 103-2 changes the cycle (frequency) of the refresh timing signal generated by the self-oscillator 103-1 and outputs the refresh timing signal.

The refresh timing signal generated by the refresh timing signal generation section 103 is inputted to a circuit block (not shown) which generates a refresh implementation signal for performing the operation of refreshing the contents of a memory cell (not shown) included in the DRAM.

The constant current generation circuit 104 generates current Iref.

The low-temperature constant current setting circuit 105 designates the level of the current Iref generated by the constant current generation circuit 104 in the case that the temperature detected is lower than or equal to the cycle change temperature.

The high-temperature constant current setting circuit 106 designates the level of the current Iref generated by the constant current generation circuit 104 in the case that the temperature detected is higher than the cycle change temperature.

At test time the low-temperature constant current setting circuit 105 and the high-temperature constant current setting circuit 106 can desiredly adjust the level of the current Iref. In addition, each of the low-temperature constant current setting circuit 105 and the high-temperature constant current setting circuit 106 includes a plurality of fuses and stores, by cutting fuses located at predetermined positions, the level of the current Iref at the time of the refresh cycle matching a desired value at a designated temperature at the test time. At actual operation time each of the low-temperature constant current setting circuit 105 and the high-temperature constant current setting circuit 106 outputs a code for designating the level of the current Iref to be generated according to the positions cut. The details will be described later.

If the temperature is lower than or equal to the cycle change temperature, then the selection circuit 107 is controlled by the cycle change control section 102 to select the code for designating the level of the current Iref stored in the low-temperature constant current setting circuit 105 and to send the code to the constant current generation circuit 104. If the temperature is higher than the cycle change temperature, then the selection circuit 107 selects the code for designating the level of the current Iref stored in the high-temperature constant current setting circuit 106 and sends the code to the constant current generation circuit 104.

The trimming test mode circuit 108 and the constant current monitor circuit 109 are used at the test time. The details will be described later.

A refresh cycle control method used by the semiconductor memory 100a according to the first embodiment of the present invention will now be described.

Figure 2A:
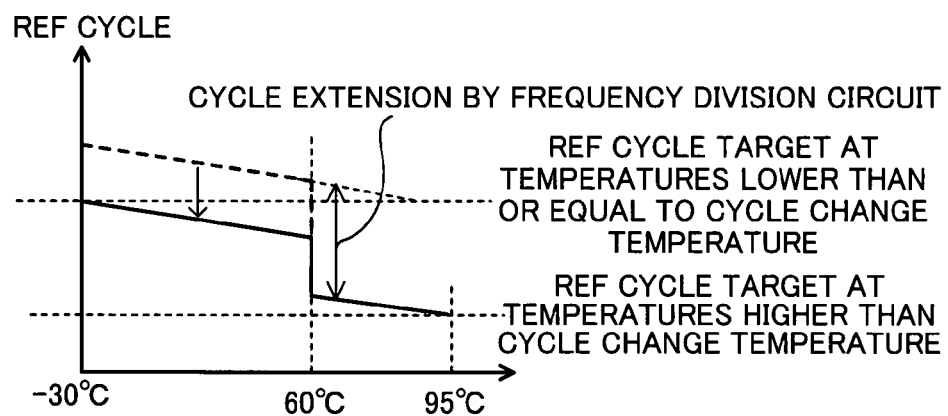
FIGS. 2A and 2B show refresh cycle control exercised in the semiconductor memory according to the first embodiment of the present invention.
Figure 2B:
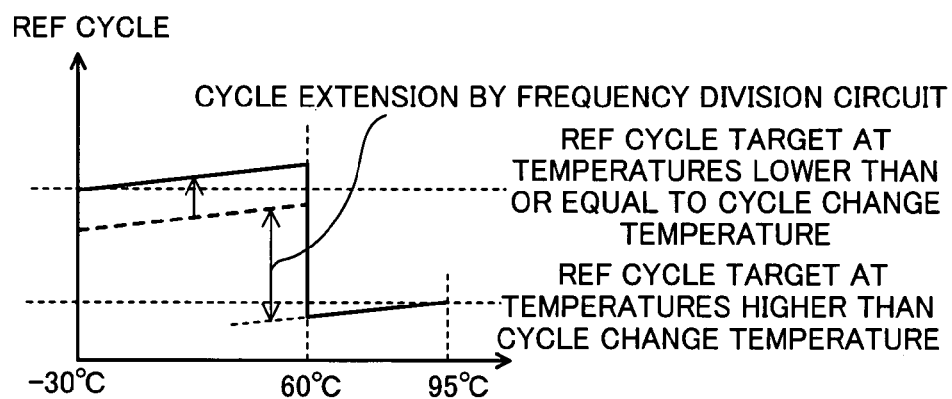

FIGS. 2A and 2B show refresh cycle control exercised in the semiconductor memory according to the first embodiment of the present invention.

FIG. 2A shows refresh cycle control exercised in the case that the dependence of the current Iref on temperature in the chip is negative. FIG. 2B shows refresh cycle control exercised in the case that the dependence of the current Iref on temperature in the chip is positive.

As shown in FIGS. 2A and 2B, it is assumed that the refresh cycle is made to match the desired value at a temperature of, for example, −30° C. At test time the level of the current Iref is adjusted by the low-temperature constant current setting circuit 105. Fuses are cut so that the low-temperature constant current setting circuit 105 will indicate the level of the current Iref at the time of the refresh cycle matching the desired value. The low-temperature constant current setting circuit 105 then stores a code represented by positions where the fuses are cut as information for designating the level of the current Iref to be used in the case of the temperature being lower than or equal to the cycle change temperature.

In addition, as shown in FIGS. 2A and 2B, it is assumed that the refresh cycle is made to match the desired value at a temperature of, for example, 95° C. At test time the level of the current Iref is adjusted by the high-temperature constant current setting circuit 106. Fuses are cut so that the high-temperature constant current setting circuit 106 will indicate the level of the current Iref at the time of the refresh cycle matching the desired value. The high-temperature constant current setting circuit 106 then stores a code represented by positions where the fuses are cut as information for designating the level of the current Iref to be used in the case of the temperature being higher than the cycle change temperature. This is the same with the case where the refresh cycle is made to match the desired value at a temperature of −30° C.

If at actual operation time the temperature of the semiconductor memory 100a is higher than the cycle change temperature (60° C. in the case of FIGS. 2A and 2B), the selection circuit 107 selects the code stored in the high-temperature constant current setting circuit 106 and sends the code to the constant current generation circuit 104. The constant current generation circuit 104 generates the current Iref the level of which corresponds to the code. The self-oscillator 103-1 included in the refresh timing signal generation section 103 generates a refresh timing signal on the basis of the current Iref generated. As a result, a refresh cycle which matches the desired value at a temperature of 95° C. is obtained regardless of the temperature dependence of the current Iref.

When the temperature of the semiconductor memory 100a drops and becomes lower than or equal to the cycle change temperature, the cycle change control section 102 sends a cycle change signal. The cycle change signal is inputted to the frequency division circuit 103-2 included in the refresh timing signal generation section 103. The frequency division circuit 103-2 makes frequency division so that the cycle of a refresh timing signal generated by the self-oscillator 103-1 will become longer than the cycle of the refresh timing signal generated in the case of the temperature of the semiconductor memory 100a being higher than the cycle change temperature. The selection circuit 107 selects the code stored in the low-temperature constant current setting circuit 105 and sends the code to the constant current generation circuit 104. The constant current generation circuit 104 generates the current Iref the level of which corresponds to the code. The self-oscillator 103-1 included in the refresh timing signal generation section 103 generates the refresh timing signal on the basis of the current Iref generated.

As a result, as shown in FIGS. 2A and 2B, even if a cycle extension rate in the frequency division circuit 103-2 is uniform regardless of the temperature dependence of the current Iref, the refresh cycle can be made to match the desired value at a set temperature of −30° C. Therefore, variation in the refresh cycle can be suppressed and an increase in the standby current can be prevented.

By the way, if the dependence of the current Iref on temperature is positive as shown in FIG. 2B and an adjustment is made by the low-temperature constant current setting circuit 105 to make the refresh cycle match the desired value at a temperature of, for example, −30° C., the difference between data retention time and the refresh cycle may become small.

Figure 3A:
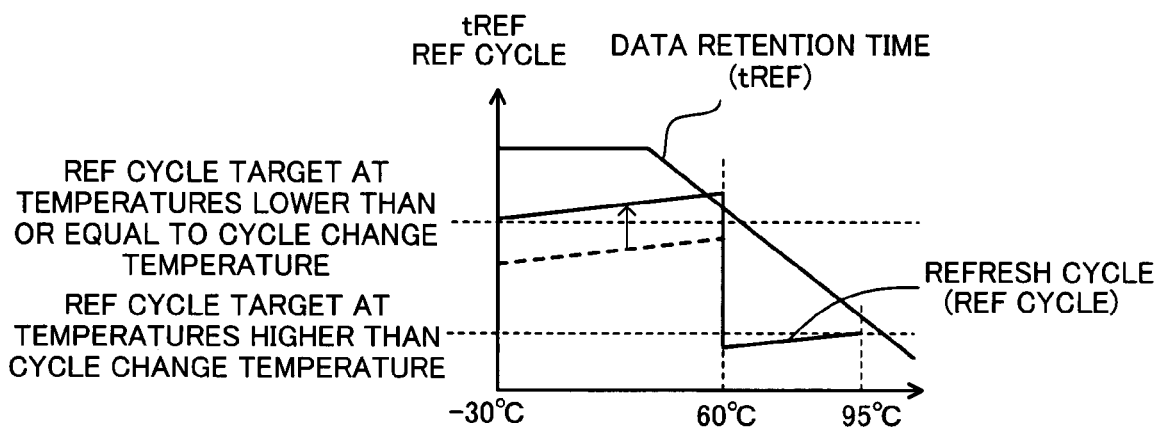
FIGS. 3A and 3B show an example of refresh cycle control exercised in the case of positive temperature dependence.
Figure 3B:
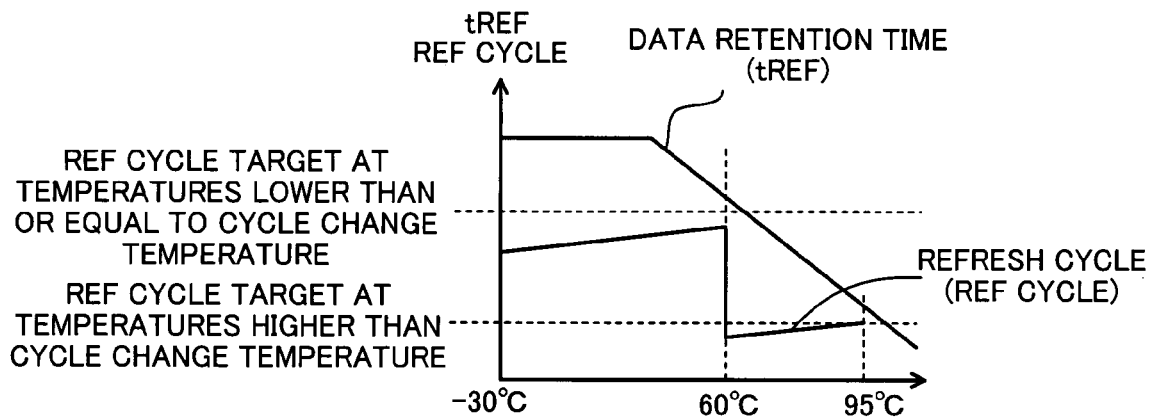

FIGS. 3A and 3B show an example of refresh cycle control exercised in the case of positive temperature dependence.

As shown in FIG. 3A, if the temperature of the semiconductor memory 100a is lower than or equal to the cycle change temperature, the refresh cycle is extended by the frequency division circuit 103-2, and an adjustment is made to make the refresh cycle match the desired value at a temperature of, for example, −30° C., then the refresh cycle may exceed the data retention time. To prevent such a situation, at the test time the same code that is stored in the high-temperature constant current setting circuit 106 should be stored in the low-temperature constant current setting circuit 105 if the dependence of the current Iref on temperature is positive. The code stored in the low-temperature constant current setting circuit 105 indicates the level of the current Iref. As a result, as shown in FIG. 3B, an extension of the refresh cycle at the cycle change temperature is limited to a portion by which the frequency division circuit 103-2 extends the refresh cycle. Therefore, there is a great difference between the data retention time and the refresh cycle.

To measure the dependence of the current Iref on temperature, the constant current monitor circuit 109, for example, included in the semiconductor memory 100a according to the first embodiment of the present invention is used. At the test time a constant current monitor test mode circuit 109-1 uses a monitor enable signal for making a constant current monitor control circuit 109-2 acquire constant current generation voltage Vref from the constant current generation circuit 104. The constant current monitor control circuit 109-2 amplifies the constant current generation voltage Vref and converts the constant current generation voltage Vref into an electric current. The constant current monitor control circuit 109-2 is connected to a test terminal 109-3. An external tester or the like is connected to the test terminal 109-3 and the electric current is measured at two different temperatures. By doing so, whether the dependence of the current Iref on temperature is positive or negative can be determined.

In addition, the cycle or frequency of the refresh timing signal outputted from the self-oscillator 103-1 or the frequency division circuit 103-2 may be measured at different temperatures. By doing so, the dependence of the current Iref on temperature can be detected.

Furthermore, the constant current generation circuit 104 may make an external tester, an external measuring device or the like grasp a voltage division code which is generated on the basis of the code stored in the low-temperature constant current setting circuit 105 and which is used for dividing predetermined voltage and determining the level of the current Iref and a voltage division code which is generated on the basis of the code stored in the high-temperature constant current setting circuit 106 and which is used for dividing predetermined voltage and determining the level of the current Iref. By comparing these voltage division codes, the dependence of the current Iref on temperature can be detected. The details will be described later.

The process of storing the codes for designating the levels of the current Iref in the low-temperature constant current setting circuit 105 and the high-temperature constant current setting circuit 106 at the test time and the generation of the current Iref corresponding to the codes will now be described in detail.

Figure 4:
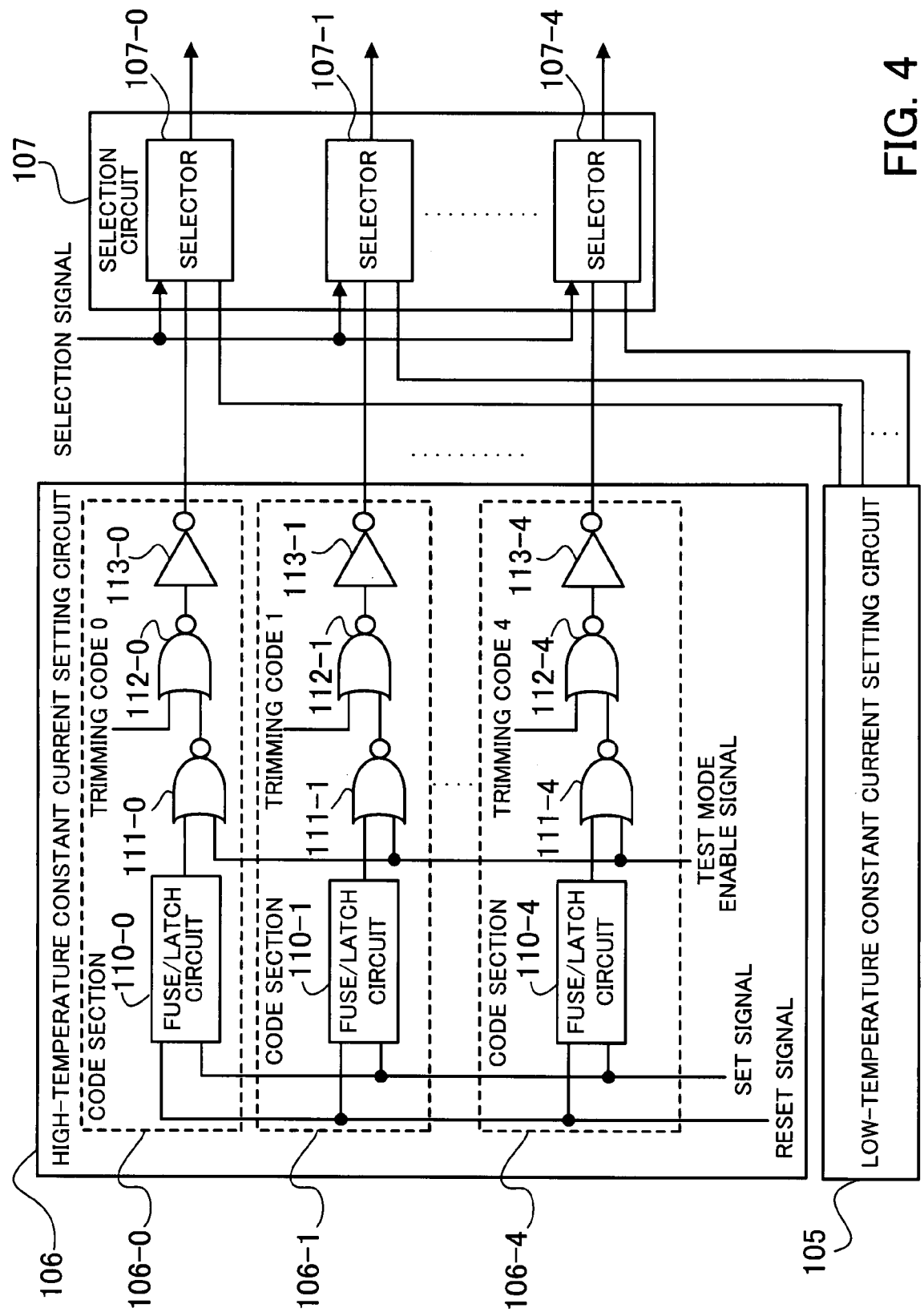
FIG. 4 is a circuit diagram showing the details of a constant current setting circuit and a selection circuit.

FIG. 4 is a circuit diagram showing the details of the constant current setting circuit and the selection circuit.

For example, the high-temperature constant current setting circuit 106 includes five code sections 106-0, 106-1, . . . , and 106-4. The code sections 106-0 to 106-4 include fuse/latch circuits 110-0 to 110-4 (collectively referred to as 110), NOR circuits 111-0 to 111-4 (collectively referred to as 111) and 112-0 to 112-4 (collectively referred to as 112), and inverter circuits 113-0 to 113-4 (collectively referred to as 113), respectively.

The fuse/latch circuits 110 includes a fuse and a latch circuit. The state of the fuse (whether the fuse is cut) is written into the latch circuit by a set signal or a reset signal according to the state of the fuse. Hereinafter it is assumed that if the fuse is cut, then "0" is written and that if the fuse is not cut, then "1" is written.

One input terminal of the NOR circuit 111 is connected to the fuse/latch circuit 110 and a test mode enable signal is inputted from the trimming test mode circuit 108 shown in FIG. 1 to the other input terminal. The test mode enable signal is at the high (H) level at the test time and is at the low (L) level at the actual operation time.

An output terminal of the NOR circuit 111 is connected to one input terminal of the NOR circuit 112 and one of trimming codes 0 through 4 is inputted from the trimming test mode circuit 108 to the other input terminal of the NOR circuit 112. Output from the NOR circuit 112 is inverted by the inverter circuit 113 and is outputted from the high-temperature constant current setting circuit 106.

In the high-temperature constant current setting circuit 106 having the above structure, the level of the current Iref to be generated by the constant current generation circuit 104 is designated by which fuses of the fuse/latch circuits 110-0 through 110-4 included in the code sections 106-0 through 106-4, respectively, are cut. At the test time, however, the refresh cycle is adjusted to the desired value. Accordingly, before fuses are actually cut, a code for designating the level of the current Iref is generated by making the test mode enable signal the H level and changing the trimming codes 0 through 4 to "0" or "1".

At the test time the test mode enable signal becomes the H level, so output from the NOR circuits 111-0 through 111-4 becomes "0". For example, if the trimming codes 0 and 1 are "1" and the trimming codes 2 through 4 are "0," then output from the NOR circuit 112-0 through 112-4 is "00111". This output is inverted by the inverter circuit 113-0 through 113-4 and the code "11000" is outputted from the high-temperature constant current setting circuit 106. If the refresh cycle is adjusted to the desired value by this code, then fuses are cut according to this code. For example, to obtain the above code "11000," the fuses included in the fuse/latch circuits 110-0 and 110-1 are cut. When the semiconductor memory 100*a* is started, the state of a fuse included in each fuse/latch circuit 110 is detected by an external control unit. If a fuse is cut, then "0" is set in a corresponding fuse/latch circuit 110. If a fuse is not cut, then "1" is set in a corresponding fuse/latch circuit 110.

The structure of the low-temperature constant current setting circuit 105 is the same as that of the high-temperature constant current setting circuit 106, so descriptions of the low-temperature constant current setting circuit 105 will be omitted.

The selection circuit 107 includes selectors 107-0, 107-1, . . . , and 107-4. Output from the inverter circuit 113-0 through 113-4 included in the code sections 106-0 through 106-4, respectively, of the high-temperature constant current setting circuit 106 or the low-temperature constant current setting circuit 105 is inputted to the selectors 107-0, 107-1, . . . , and 107-4. If the temperature of the semiconductor memory 100*a* is lower than or equal to the cycle change temperature, then the code outputted from the low-temperature constant current setting circuit 105 is selected by a selection signal sent from the cycle change control section 102 shown in FIG. 1. If the temperature of the semiconductor memory 100*a* is higher than the cycle change temperature, then the code outputted from the high-temperature constant current setting circuit 106 is selected.

The constant current generation circuit 104 generates the current Iref to be used by the refresh timing signal generation section 103 according to a code selected.

Figure 5:
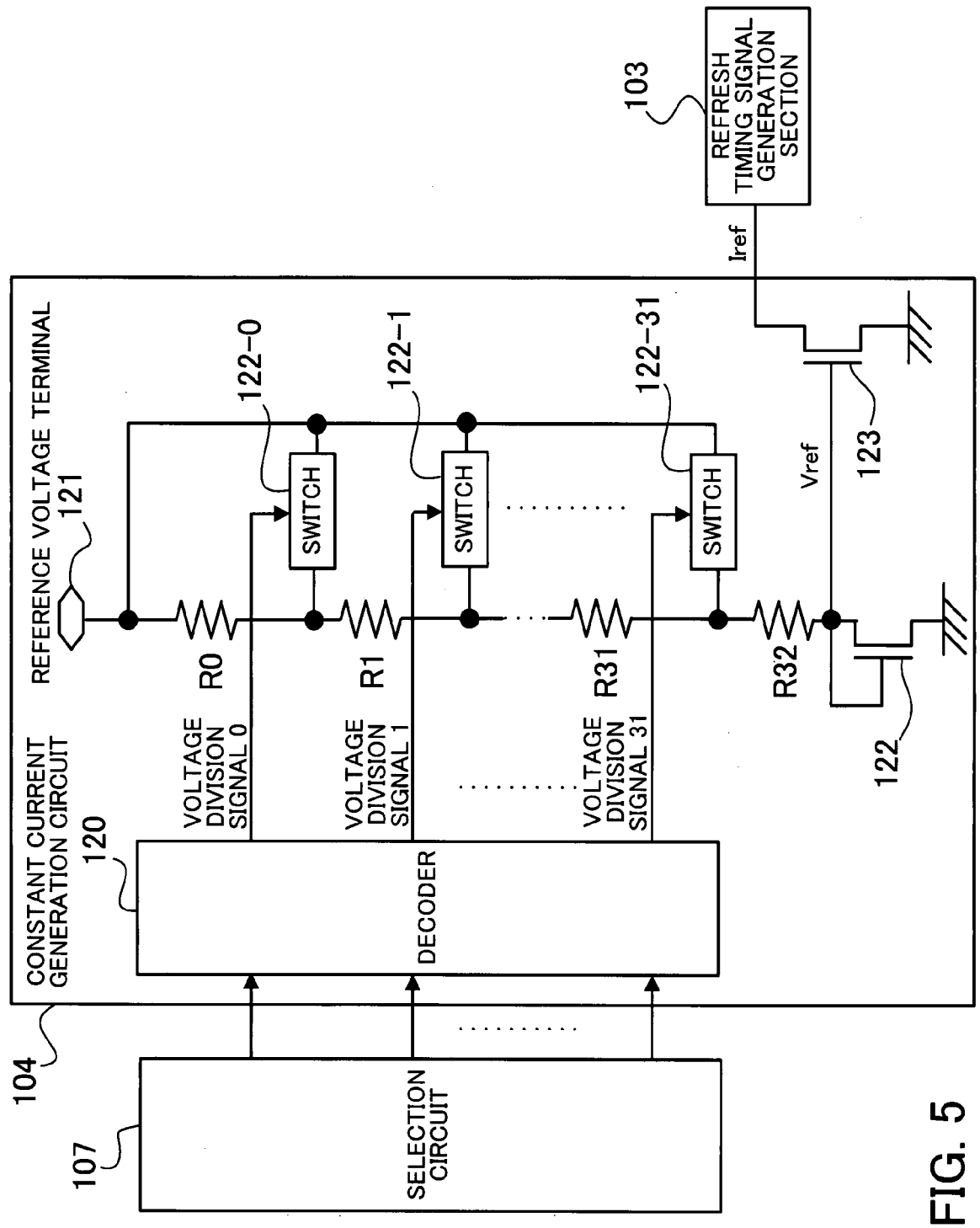
FIG. 5 is a circuit diagram showing an example of a constant current generation circuit.

FIG. 5 is a circuit diagram showing an example of the constant current generation circuit.

The constant current generation circuit 104 includes a decoder 120, resistors R0, R1, . . . , R31, and R32 connected in series between a reference voltage terminal 121 and a drain of an n-channel metal oxide semiconductor (MOS) transistor (NMOS) 122, switches 122-0, 122-1, . . . , and 122-31 which turn on or off according to a voltage division code made up of voltage division signals 0, 1, . . . , and 31 that are decoding results and which divide reference voltage, and an NMOS 123 located at an output stage. A source of the NMOS 122 is grounded and a gate of the NMOS 122 is connected to the drain of the NMOS 122. Gate voltage and drain voltage of the NMOS 122 is constant current generation voltage Vref. The constant current generation voltage Vref is inputted to a gate of the NMOS 123 and drain current of the NMOS 123 is the current Iref used by the refresh timing signal generation section 103.

In the constant current generation circuit 104 having the above structure, a predetermined number of switches of the switches 122-0 through 122-31 are turned on or off by the use of the voltage division signals 0 through 31 generated by decoding a code outputted from the selection circuit 107. By doing so, the reference voltage is divided, gate voltage of the NMOS 123 is determined, and the current Iref is generated. Voltage division codes used for turning on or off the switches 122-0 through 122-31 and for dividing the reference voltage are generated both in the case of the temperature of the semiconductor memory 100a being lower than or equal to the cycle change temperature and in the case of the temperature of the semiconductor memory 100a being higher than the cycle change temperature. Therefore, as stated above, the dependence of the current Iref on temperature can be detected by comparing these voltage division codes.

A semiconductor memory according to a second embodiment of the present invention will now be described.

Figure 6:
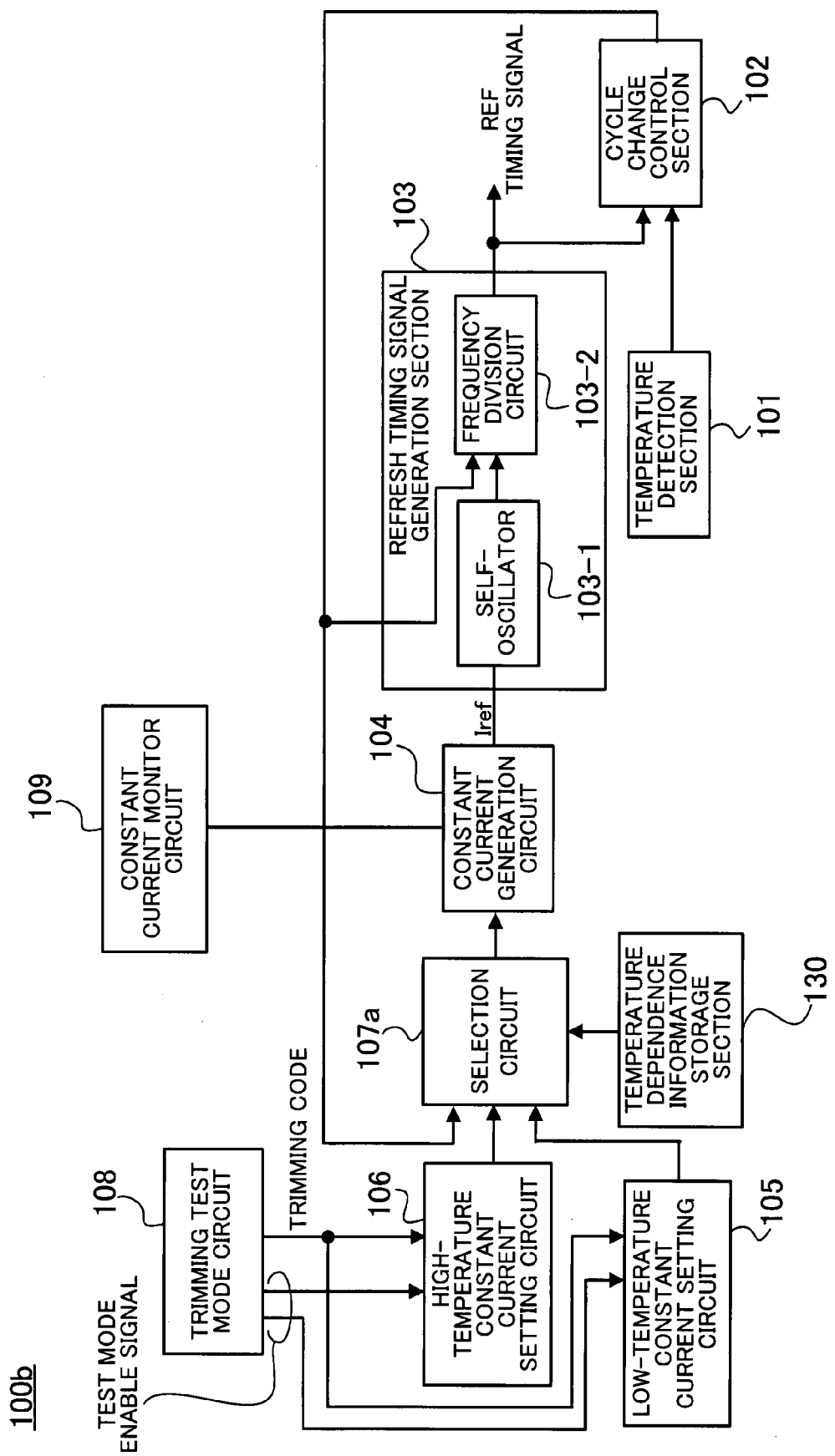
FIG. 6 shows the structure of a semiconductor memory according to a second embodiment of the present invention.

FIG. 6 shows the structure of a semiconductor memory according to a second embodiment of the present invention.

Components of a semiconductor memory according to a second embodiment of the present invention that are the same as those of the semiconductor memory 100a according to the first embodiment of the present invention are marked with the same symbols and descriptions of them will be omitted.

A semiconductor memory 100b according to a second embodiment of the present invention differs from the semiconductor memory 100a according to the first embodiment of the present invention in that it includes a temperature dependence information storage section 130 for storing information indicative of the dependence of current Iref on temperature measured at test time. In addition, a selection circuit 107a included in the semiconductor memory 100b differs partly from the selection circuit 107 included in the semiconductor memory 100a in function. The temperature dependence information storage section 130 includes, for example, a fuse. Whether the dependence of the current Iref on temperature is positive or negative can be indicated by whether or not the fuse is cut.

As stated above, an external tester is used for measuring an electric current at two different temperatures. By doing so, the dependence of the current Iref on temperature can be detected. In addition, the cycle or frequency of a refresh timing signal outputted from a self-oscillator 103-1 or a frequency division circuit 103-2 may be measured at different temperatures. By doing so, the dependence of the current Iref on temperature can be detected. Furthermore, an external tester, an external measuring device or the like may be made to grasp voltage division codes which are used by a constant current generation circuit 104 and which are generated in the case that the temperature of the semiconductor memory 100b is lower than or equal to a cycle change temperature and in the case that the temperature of the semiconductor memory 100b is higher than the cycle change temperature. By comparing these voltage division codes, the dependence of the current Iref on temperature can be detected.

As shown in FIG. 3A, if the dependence of the current Iref on temperature is positive and an adjustment is made to make a refresh cycle match a desired value at a temperature lower than or equal to the cycle change temperature, then the refresh cycle may exceed data retention time or the difference between the refresh cycle and the data retention time may become small. To prevent such a situation, the following method is adopted. If the dependence of the current Iref on temperature stored in the temperature dependence information storage section 130 is positive and the temperature of the semiconductor memory 100b is lower than or equal to the cycle change temperature, the selection circuit 107a selects and outputs a code stored in a high-temperature constant current setting circuit 106 even when a selection signal for using a code stored in a low-temperature constant current setting circuit 105 is inputted from a cycle change control section 102. This prevents the difference between the refresh cycle and the data retention time from becoming small.

If the dependence of the current Iref on temperature stored in the temperature dependence information storage section 130 is negative and the temperature of the semiconductor memory 100b is lower than or equal to the cycle change temperature, then the selection circuit 107a selects the code stored in the low-temperature constant current setting circuit 105 in accordance with a selection signal sent from the cycle change control section 102. If the temperature of the semiconductor memory 100b is higher than the cycle change temperature, then the selection circuit 107a selects the code stored in the high-temperature constant current setting circuit 106 in accordance with a selection signal sent from the cycle change control section 102. This is the same with the semiconductor memory 100a according to the first embodiment of the present invention.

A semiconductor memory according to a third embodiment of the present invention will now be described.

Figure 7:
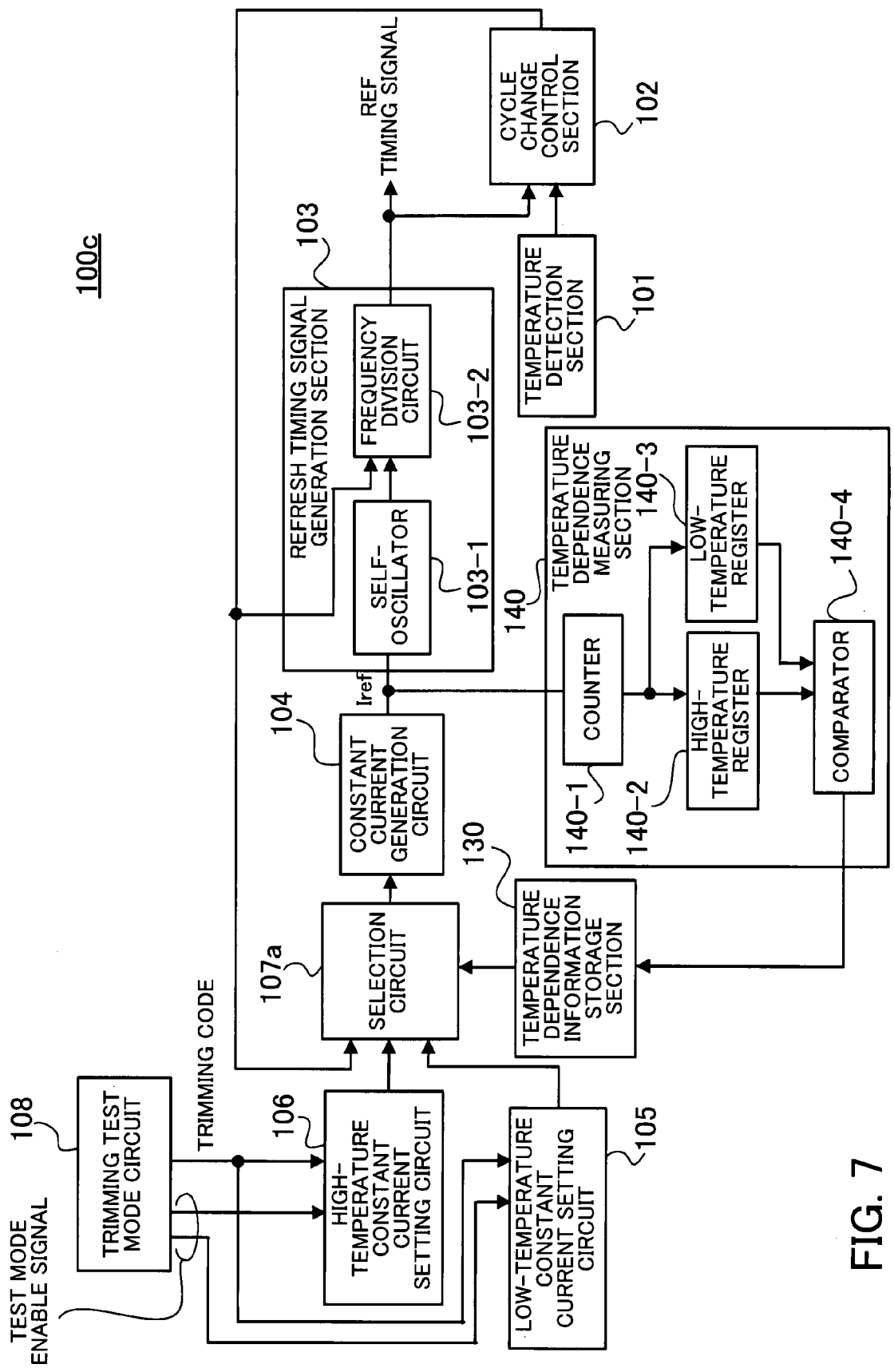
FIG. 7 shows the structure of a semiconductor memory according to a third embodiment of the present invention.
Figure 8:
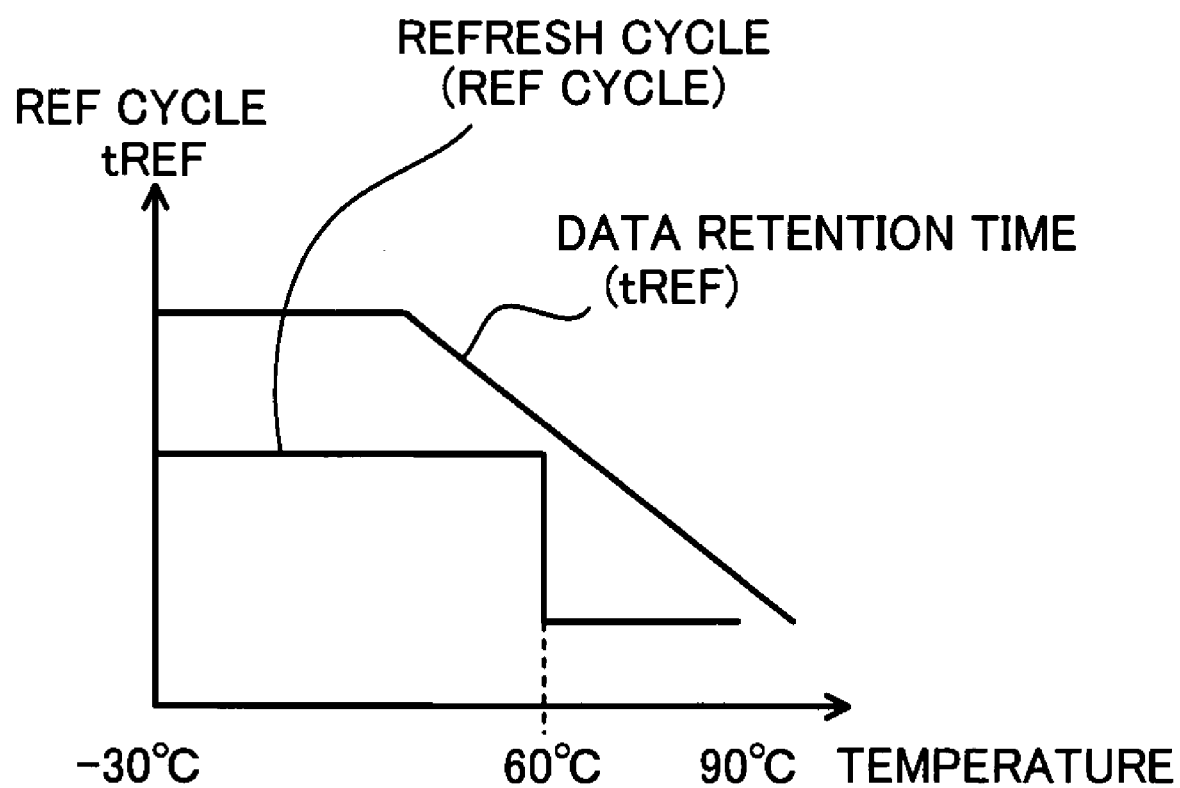
FIG. 8 shows an example of changing a refresh cycle according to temperature.
Figure 9A:
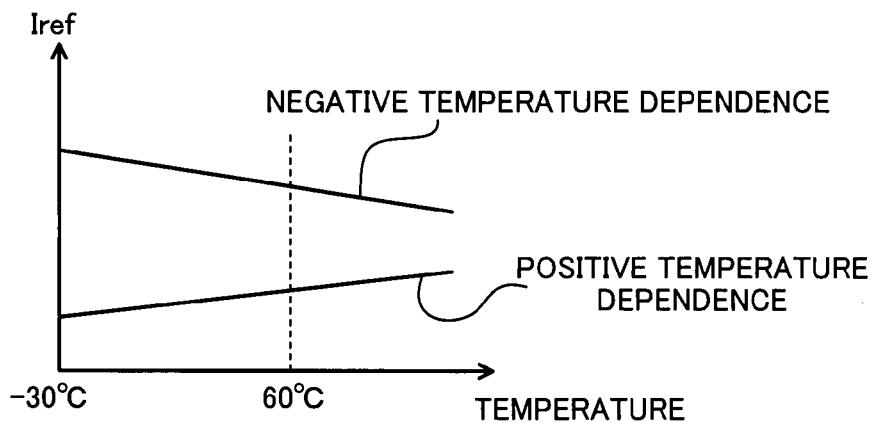
FIGS. 9A, 9B, and 9C show the temperature characteristic of current generated by a constant current generation circuit and the temperature characteristic of a refresh cycle.
Figure 9B:
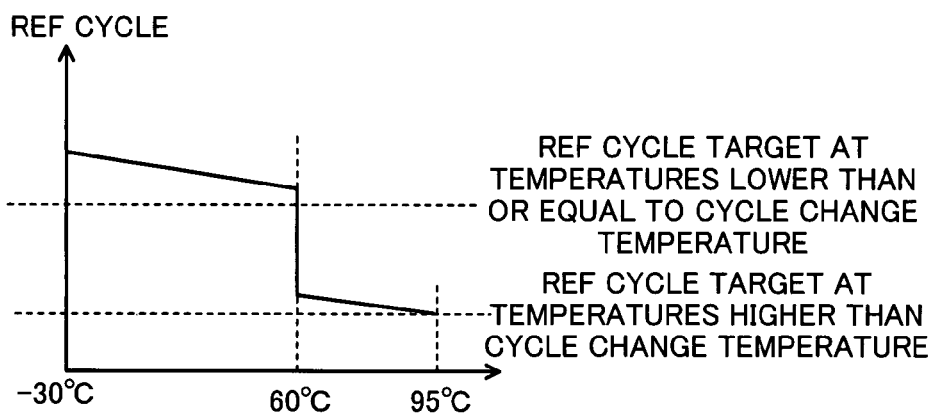
Figure 9C:
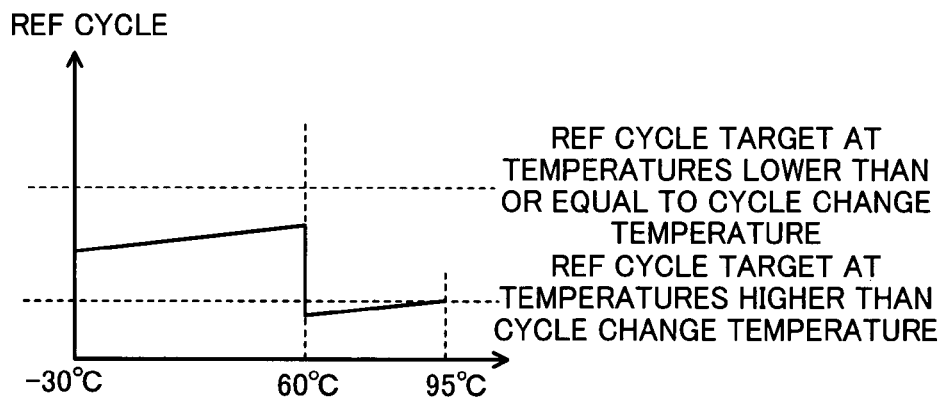
Figure 10A:
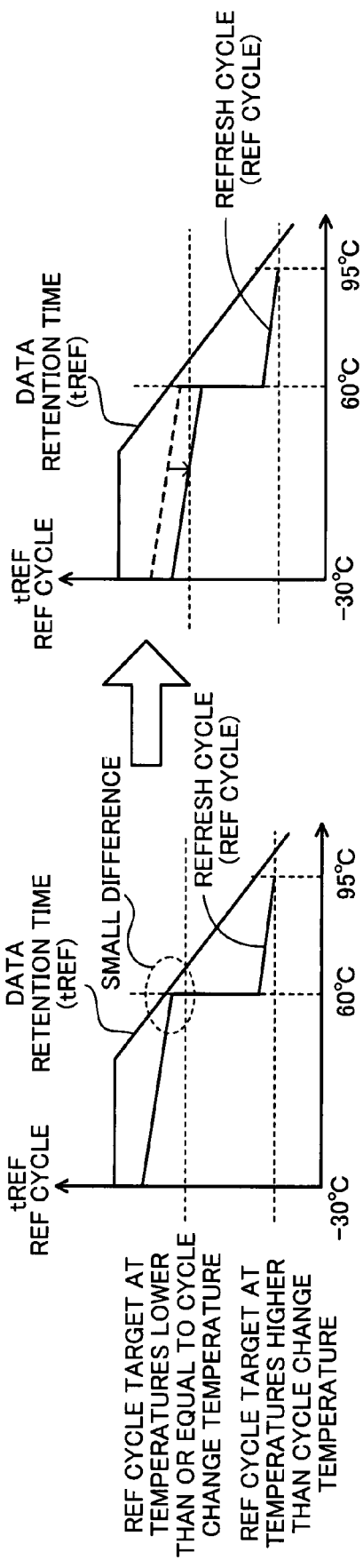
FIGS. 10A and 10B show how a conventional refresh cycle adjustment is made.
Figure 10B:
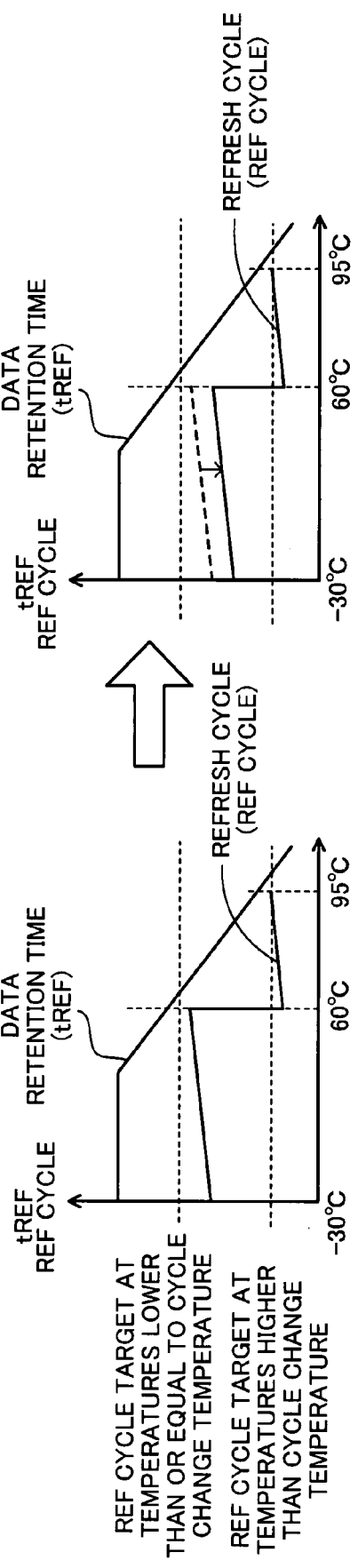

FIG. 7 shows the structure of a semiconductor memory according to a third embodiment of the present invention.

Components of a semiconductor memory according to a third embodiment of the present invention that are the same as those of the semiconductor memories 100a and 100b according to the first embodiment and the second embodiment, respectively, of the present invention are marked with the same symbols and descriptions of them will be omitted.

As with the semiconductor memory 100b according to the second embodiment of the present invention, a semiconductor memory 100c according to a third embodiment of the present invention includes a temperature dependence information storage section 130 for storing the dependence of current Iref on temperature. Unlike the semiconductor memory 100b according to the second embodiment of the present invention, however, the semiconductor memory 100c according to the third embodiment of the present invention does not need a constant current monitor circuit 109 or an external tester used for measuring the dependence of the current Iref on temperature, and includes a temperature dependence measuring section 140 for measuring the dependence of the current Iref on temperature inside the semiconductor memory 100c.

The temperature dependence measuring section 140 includes a counter 140-1, a high-temperature register 140-2, a low-temperature register 140-3, and a comparator 140-4.

The counter 140-1 counts the level of the current Iref generated by a constant current generation circuit 104.

The high-temperature register 140-2 holds the value of the counter 140-1 at the time of performing a test at a high temperature (95° C., for example).

The low-temperature register 140-3 holds the value of the counter 140-1 at the time of performing a test at a low temperature (−30° C., for example).

The comparator 140-4 compares the value held by the high-temperature register 140-2 with the value held by the low-temperature register 140-3, outputs a comparison result as temperature dependence information, and stores the comparison result in the temperature dependence information storage section 130.

With the semiconductor memory 100c according to the third embodiment of the present invention, the levels of the current Iref at different temperatures are compared in this way by using the values of the above counter 140-1. By doing so, the dependence of the current Iref on temperature can be detected inside the semiconductor memory 100c without an external tester or the like. As a result, test time can be shortened.

The present invention has been described on the basis of the embodiments. However, the present invention is not limited to the above embodiments and various modifications are possible within the scope described in the claims.

For example, in the above embodiments the current Iref for generating the refresh timing signal is generated by the constant current generation circuit 104. However, a constant voltage generation circuit or the like may be used for generating a signal for generating the refresh timing signal.

With the present invention, both of the level of the signal for generating the refresh timing signal in the case that the temperature of the semiconductor memory is lower than or equal to the cycle change temperature and the level of the signal for generating the refresh timing signal in the case that the temperature of the semiconductor memory is higher than the cycle change temperature can be designated. Accordingly, even if a cycle extension rate at the cycle change temperature is uniform, a refresh cycle can be made to match a desired value in each chip regardless of the dependence of the signal on temperature. This prevents an increase in standby current.

In addition, if the signal for generating the refresh timing signal has temperature dependence by which the level of the signal increases with a rise in temperature and the temperature of the semiconductor memory is lower than or equal to the cycle change temperature, the level of the signal in the case that the temperature of the semiconductor memory is higher than the cycle change temperature should be designated. This prevents a situation in which the refresh cycle exceeds data retention time.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory that needs refresh operation, the memory comprising:
    a temperature detection section for detecting temperature of the semiconductor memory;
    a cycle change control section for sending a cycle change signal for changing a refresh cycle at the time of the temperature of the semiconductor memory becoming a predetermined cycle change temperature;
    a refresh timing signal generation section for generating a refresh timing signal and for changing a cycle of the refresh timing signal in response to the cycle change signal;
    a signal generation circuit for generating a signal for generating the refresh timing signal;
    a first setting circuit for designating a level of the signal generated in a case of the temperature of the semiconductor memory being lower than or equal to the cycle change temperature;
    a second setting circuit for designating a level of the signal generated in a case of the temperature of the semiconductor memory being higher than the cycle change temperature;
    wherein each of the first setting circuit and the second setting circuit includes a plurality of fuses and designates the level of the signal according to a position of a fuse cut out of the plurality of fuses; and
    if the signal has temperature dependence by which the level of the signal increases with a rise in the temperature of the semiconductor memory, fuses of same positions out of the plurality of fuses in the first setting circuit and the second setting circuit are cut.

2. The semiconductor memory according to claim 1, wherein:
    the signal generated by the signal generation circuit is an electric current;
    the first setting circuit is a first constant current setting circuit for designating a level of the electric current; and
    the second setting circuit is a second constant current setting circuit for designating a level of the electric current.

3. The semiconductor memory according to claim 1, wherein each of the first setting circuit and the second setting circuit includes a plurality of fuses, and designates the level of the signal according to a position of a fuse cut out of the plurality of fuses.

4. The semiconductor memory according to claim 1, wherein if the signal has temperature dependence by which the level of the signal increases with a rise in the temperature of the semiconductor memory, the level of the signal designated by the first setting circuit is equal to the level of the signal designated by the second setting circuit.

5. The semiconductor memory according to claim 1, further comprising:
    a selection circuit for selecting one to be used by the signal generation circuit from the level of the signal designated by the first setting circuit and the level of the signal designated by the second setting circuit; and
    a temperature dependence information storage section for storing temperature dependence information indicative of temperature dependence of the signal,
    wherein if the temperature dependence information stored indicates the temperature dependence by which the level of the signal increases with a rise in the temperature of the semiconductor memory, the selection circuit selects the level of the signal designated by the second setting circuit even in the case of the temperature of the semiconductor memory being lower than or equal to the cycle change temperature.

6. The semiconductor memory according to claim 5, wherein:
    the temperature dependence information storage section includes a fuse; and
    the temperature dependence information is determined based on whether or not the fuse is cut.

7. The semiconductor memory according to claim 5, further comprising a temperature dependence measuring section for comparing levels of the signal generated by the signal generation circuit at different temperatures at test time and for generating the temperature dependence information according to a comparison result, wherein the temperature dependence information generated is stored in the temperature dependence information storage section.

8. The semiconductor memory according to claim 7, wherein the temperature dependence measuring section includes:
    a counting section for counting the levels of the signals;
    a storage section for holding counting results obtained by the counting section at different temperatures; and
    a comparison section for generating the temperature dependence information according to a result obtained by comparing the counting results at the different temperatures.

9. A refresh cycle control method for a semiconductor memory that needs refresh operation, the method comprising the steps of:
    storing first designation information for designating a level of a signal for generating a refresh timing signal in a first setting circuit in a case of temperature of the semiconductor memory being lower than or equal to a cycle change temperature at which a refresh cycle is changed;

storing second designation information for designating the level of the signal in a second setting circuit in a case of the temperature of the semiconductor memory being higher than the cycle change temperature;

generating the signal the level of which is designated by the first designation information or the second designation information according to the temperature of the semiconductor memory;

generating the refresh timing signal by the use of the signal;

wherein each of the first setting circuit and the second setting circuit includes a plurality of fuses, and designates the level of the signal according to a position of a fuse cut out of the plurality of fuses; and if the signal has temperature dependence by which the level of the signal increases with a rise in the temperature of the semiconductor memory, fuses of same positions out of the plurality of fuses in the first setting circuit and the second setting circuit are cut.

10. The refresh cycle control method according to claim 9, wherein the signal is an electric current generated by a constant current generation circuit.

11. The refresh cycle control method according to claim 9, wherein each of the first setting circuit and the second setting circuit includes a plurality of fuses, and designates the level of the signal according to a position of a fuse cut out of the plurality of fuses.

12. The refresh cycle control method according to claim 9, wherein if the signal has temperature dependence by which the level of the signal increases with a rise in the temperature of the semiconductor memory, the first designation information indicative of a same level of the signal that is indicated by the second designation information is stored in the first setting circuit.

13. The refresh cycle control method according to claim 12, wherein the temperature dependence is detected by measuring the signal at different temperatures.

14. The refresh cycle control method according to claim 12, wherein the temperature dependence is detected by measuring the refresh cycle or a frequency of the refresh timing signal at different temperatures.

15. The refresh cycle control method according to claim 12, wherein the temperature dependence is detected by comparing a first voltage division code which is generated on the basis of the first designation information and which determines the level of the signal by dividing predetermined voltage and a second voltage division code which is generated on the basis of the second designation information and which determines the level of the signal by dividing the predetermined voltage in a signal generation circuit for generating the signal.

16. The refresh cycle control method according to claim 9, wherein:

temperature dependence information indicative of temperature dependence of the signal is stored, if the temperature dependence information stored indicates the temperature dependence by which the level of the signal increases with a rise in the temperature of the semiconductor memory, the signal the level of which is designated by the second designation information is generated even in the case of the temperature of the semiconductor memory being lower than or equal to the cycle change temperature.

17. The refresh cycle control method according to claim 16, wherein:

levels of the signal generated at different temperatures are compared; and the temperature dependence information is generated according to a comparison result.

* * * * *